(12) United States Patent
Liu et al.

(10) Patent No.: US 9,647,041 B2
(45) Date of Patent: May 9, 2017

(54) ORGANIC LIGHT EMITTING DIODE (OLED) TOUCH DISPLAY DEVICE

(71) Applicant: TPK Touch Solutions Inc., Taipei (TW)

(72) Inventors: Chen-Yu Liu, Taoyuan (TW); Li-Wei Kung, Taoyuan (TW); Hsi-Chien Lin, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 141 days.

(21) Appl. No.: 14/540,002

(22) Filed: Nov. 12, 2014

(65) Prior Publication Data

US 2015/0169094 A1    Jun. 18, 2015

(30) Foreign Application Priority Data

Nov. 12, 2013   (CN) .......................... 2013 1 0559439

(51) Int. Cl.
| | |
|---|---|
| *G06F 3/041* | (2006.01) |
| *H01L 27/32* | (2006.01) |
| *H01L 51/52* | (2006.01) |
| *G06F 3/044* | (2006.01) |

(52) U.S. Cl.
CPC ............ *H01L 27/323* (2013.01); *G06F 3/044* (2013.01); *H01L 51/5262* (2013.01)

(58) Field of Classification Search
CPC .... G06F 3/044; H01L 27/323; H01L 27/3225
USPC .................................................... 345/173, 76
See application file for complete search history.

(56) References Cited

U.S. PATENT DOCUMENTS

| | | | |
|---|---|---|---|
| 6,697,132 B2* | 2/2004 | Saiki ................... | G02B 5/3033 349/10 |
| 2010/0309150 A1* | 12/2010 | Lee ....................... | G06F 3/0412 345/173 |
| 2012/0147467 A1* | 6/2012 | Park ....................... | G06F 3/044 359/488.01 |
| 2013/0278544 A1* | 10/2013 | Cok ........................ | G06F 3/044 345/174 |
| 2013/0293096 A1* | 11/2013 | Kang ...................... | H01H 1/10 313/511 |
| 2013/0300677 A1* | 11/2013 | Kim ....................... | G06F 3/0414 345/173 |

* cited by examiner

*Primary Examiner* — Chanh Nguyen
*Assistant Examiner* — Yuzhen Shen
(74) *Attorney, Agent, or Firm* — Paul Bendemire (57) ABSTRACT

An OLED touch display device includes an OLED display and a laminated package component. The laminated package component covers the OLED display and includes a quarter-wave plate, a liquid crystal polarizer and a touch sensor unit. The touch sensor unit is a single-layer electrode structure.

10 Claims, 7 Drawing Sheets

ORGANIC LIGHT EMITTING DIODE (OLED) TOUCH DISPLAY DEVICE

BACKGROUND OF THE INVENTION

This application claims priority of Chinese Patent Application No. 201310559439.3, filed on Nov. 12, 2013, the entire disclosure of which is hereby incorporated by reference.

FIELD OF THE INVENTION

The disclosure relates to a display device, more particularly to an organic light emitting diode touch display device that provides touch sense function.

DESCRIPTION OF THE RELATED ART

Figure 1:
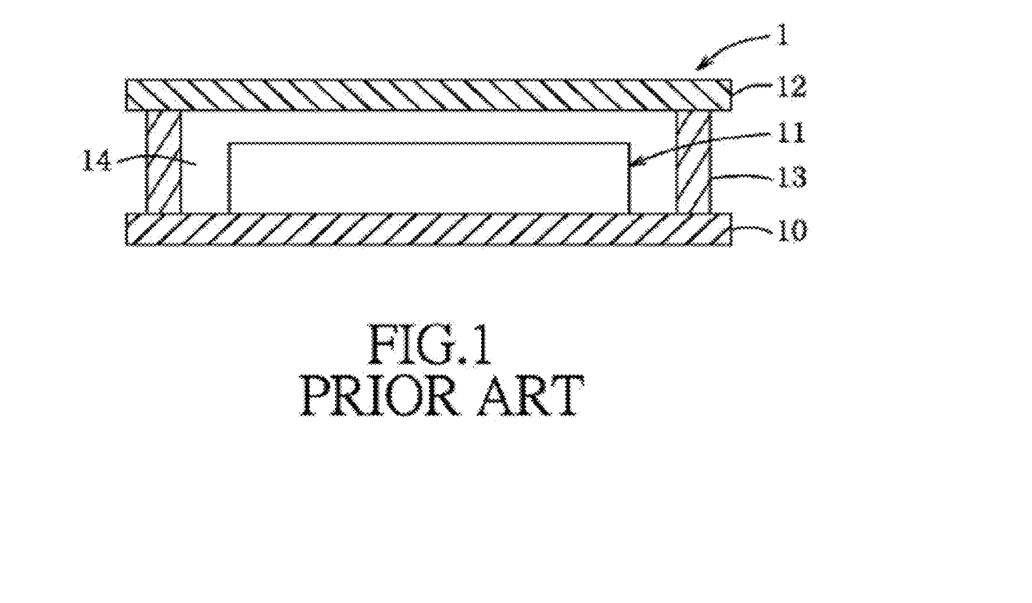
FIG. 1 is a schematic sectional view of a conventional OLED display.

Referring to FIG. 1, a conventional organic light emitting diode (abbreviated as OLED hereinafter) display 1 mainly includes a substrate 10, an organic light emitting module 11 that is disposed on the substrate 10, and a transparent cover plate 12 (e.g., a glass plate or a polyethylene terephthalate (PET) plate) that covers the organic light emitting module 11. A space 14 between peripheries of the substrate 10 and the transparent cover plate 12 would be sealed by a sealant 13 to confine the organic light emitting module 11 between the substrate 10 and the transparent cover plate 12 so as to protect the organic light emitting module 11 from absorption of moisture and oxidation.

Since the OLED display 1 is self-luminous, when operated under relatively dark ambient light conditions or indoor environments, the OLED display 1 exhibits high contrast ratio and high color saturation. However, in certain environments (such as an outdoor environment), ambient light is much brighter than that generated by the OLED, such that light reflected by a surface of the OLED display 1 overpowers the light generated by the OLED, resulting in poor visibility for a user.

Therefore, in order to solve the abovementioned problem, a conventional solution is to dispose an optical film unit (not shown) composed of a quarter-wave plate and a polarizer on the transparent cover plate 12 of the OLED display 1 to absorb the incident light from the external environment. The conventional polarizer includes a triacetate cellulose (TAC) film (as a protective layer), a polyvinyl alcohol (PVA) film (as a light polarizing body), and another TAC film (as a protective layer) that are laminated together, and has a thickness within the range from tens to hundreds of micrometers.

Moreover, to provide touch sense function to the OLED display 1, a commercially available touch sensor module (not shown) is provided on the optical film unit. However, volume and weight of the OLED display 1 with the touch sensor module would be severely increased. Therefore, it is difficult to apply to electronic devices with thin and lightweight demands.

SUMMARY OF THE INVENTION

Therefore, an object of the embodiment is to provide an OLED touch display device that has reduced thickness and weight.

According to this invention, an OLED touch display device includes an OLED display and a laminated package component. The laminated package component covers the OLED display and includes a quarter-wave plate, a liquid crystal polarizer and a touch sensor unit. The touch sensor unit is a single-layer electrode structure.

BRIEF DESCRIPTION OF THE DRAWINGS

Other features and advantages of the embodiment will become apparent in the following detailed description of the embodiments of this invention, with reference to the accompanying drawings, in which.

DETAILED DESCRIPTION OF THE EMBODIMENTS

Please note that like elements are denoted by the same reference numerals throughout the disclosure.

Figure 2:
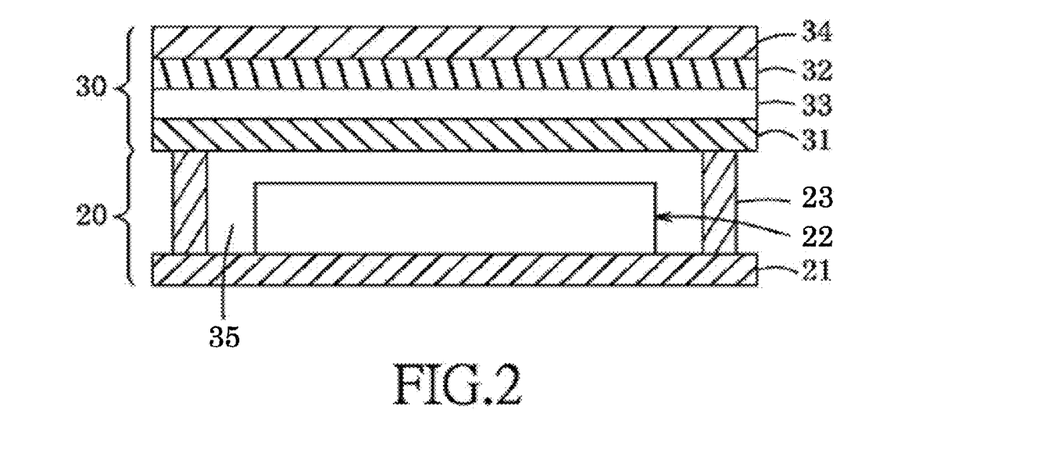
FIG. 2 is a schematic sectional view of the first embodiment of an OLED touch display device according to this invention.
Figure 3:
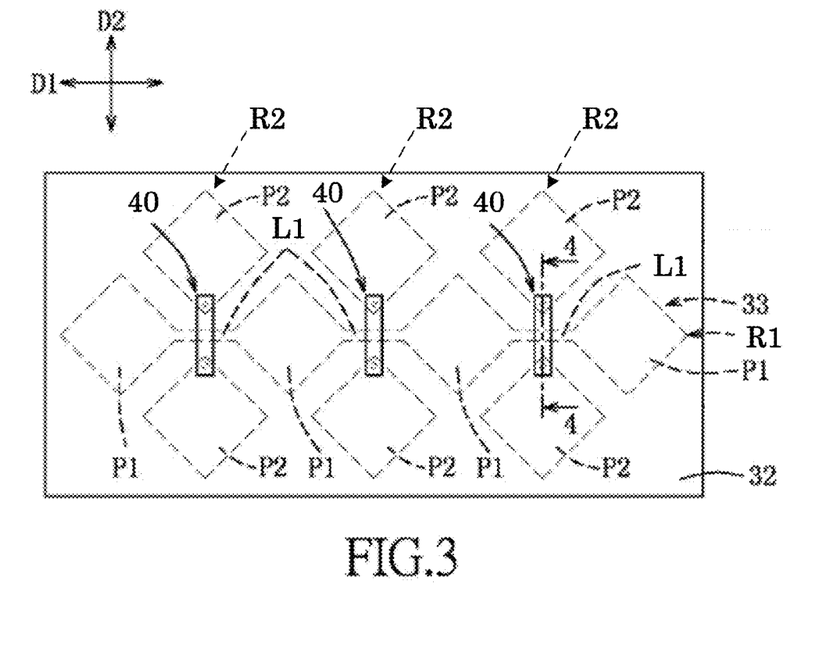
FIG. 3 is a schematic top view of the first embodiment, showing a liquid crystal polarizer and a touch sensor unit.
Figure 4:
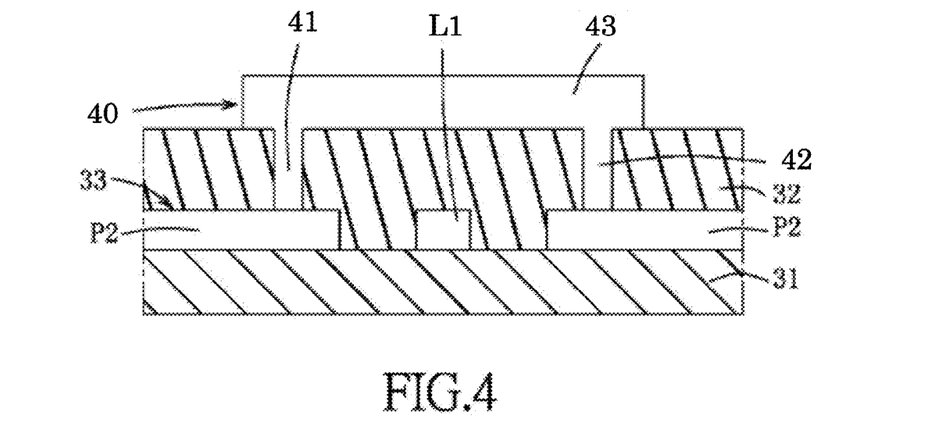
FIG. 4 is a schematic sectional view of the first embodiment taken along line 4-4 in FIG. 3.

Referring to FIGS. 2 to 4, the first embodiment of an organic light emitting diode (OLED) touch display device according to one or more embodiments of the disclosure includes an OLED display 20 and a laminated package component 30 covering the OLED display 20. The OLED display 20 includes a substrate 21 and an organic light emitting module 22 disposed on the substrate 21. The organic light emitting module 22 includes a bottom electrode layer that has a plurality of pixel electrodes, an electron-transporting layer, an organic light emitting layer, a hole-transporting layer, a hole-injection layer and a top electrode layer that are laminated in sequence along a bottom-top direction. The laminated package component 30 includes a quarter-wave plate 31, a liquid crystal polarizer 32, a touch sensor unit 33 and a cover glass 34 that are laminated together. The touch sensor unit 33 is a single-layer electrode structure.

To be more specific, as shown in FIG. 2, the quarter-wave plate 31, the touch sensor unit 33, the liquid crystal polarizer 32, and the cover glass 34 are laminated in sequence along the bottom-top direction. For manufacture of the laminated package component 30, a transparent conductive layer (not shown) is first applied on a top surface of the quarter-wave plate 31, the transparent conductive layer is subjected to etching or laser to form the touch sensor unit 33, liquid crystal is then coated on the touch sensor unit 33 using a roll-to-roll procedure to form the liquid crystal polarizer 32, and the cover glass 34 is lastly covered on the touch sensor unit 33 so as to form the laminated package component 30. The transparent conductive layers can be made of, but is not limited to, indium tin oxide (ITO), silver nano wire, carbon nano tube, conductive polymers (poly(3,4-ethylenedioxythiophene) polystyrene sulfonate, abbreviated as PEDOT: PSS), metal mesh, or graphene.

Referring to FIG. 3, the touch sensor unit 33 includes a plurality of first electrode rows (R1) that extend along a first direction (e.g., an X-axial direction) and a plurality of independent second electrodes (P2) each of which is disposed between two corresponding adjacent ones of the first electrode rows (R1). Each of the first electrode rows (R1) includes a plurality of wires (L1) and a plurality of first electrodes (P1) that are series-connected in the first direction by the wires (L1). The touch sensor unit further includes a plurality of bridge units 40 each of which is formed on the liquid crystal polarizer 32, crosses a corresponding one of the wires (L1) of each of the first electrode rows (R1), and connects two corresponding adjacent ones of the second electrodes (P2) to constitute a plurality of second electrode rows (R2) that extend along a second direction (e.g., a Y-axial direction) crossing the first direction.

As shown in FIG. 4, each of the bridge units 40 includes two conductive pillars 41, 42 extending through the liquid crystal polarizer 32 and a wire 43 disposed on a top surface of the liquid crystal polarizer 32 and interconnecting first ends of the conductive pillars 41, 42. The conductive pillars 41, 42 are respectively electrically connected to end portions of the two corresponding adjacent ones of the second electrodes (P2) at second ends thereof oppositely of the first ends. Therefore, with interconnection of the second electrodes (P2) along the second direction using the bridge units 40, a plurality of second electrode rows (R2) that cross the first electrode rows (R1) are constituted, thereby forming the single-layer electrode structure.

Afterward, the laminated package component 30 thus formed then covers the OLED display 20 with the quarter-wave plate 31 facing downwardly toward the OLED display 20. Moreover, a space 35 between peripheries of the substrate 21 and the quarter-wave plate 31 is sealed by a sealant 23 to confine the organic light emitting module 22 between the substrate 21 and the quarter-wave plate 31 so as to protect the organic light emitting module 22 from absorption of moisture and oxidation. Therefore, the OLED touch display device is accomplished.

Figure 5:
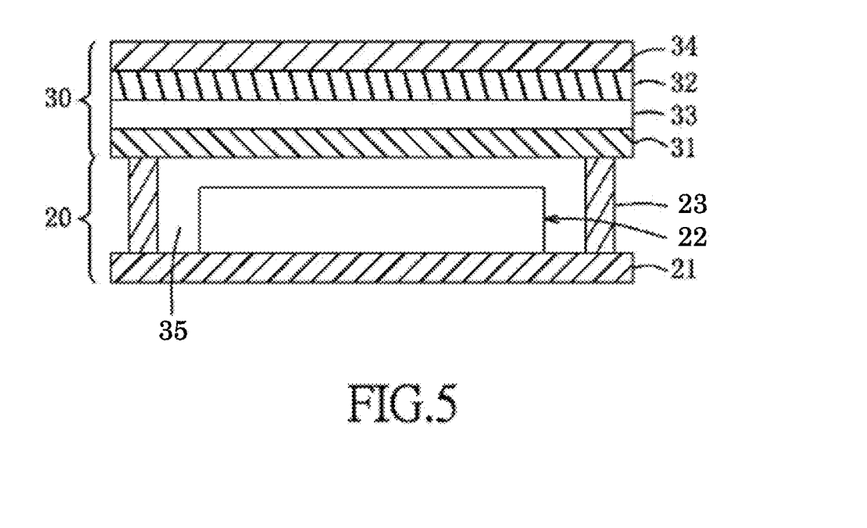
FIG. 5 is a schematic sectional view of the second embodiment of an OLED touch display device according to this invention.
Figure 6:
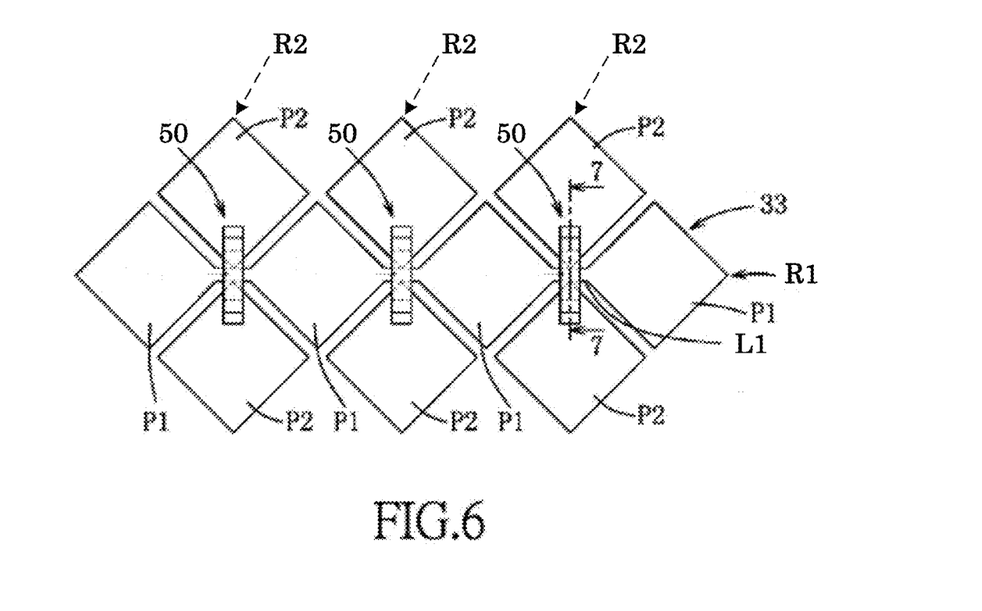
FIG. 6 is a schematic top view of a touch sensor unit of the second embodiment.
Figure 7:
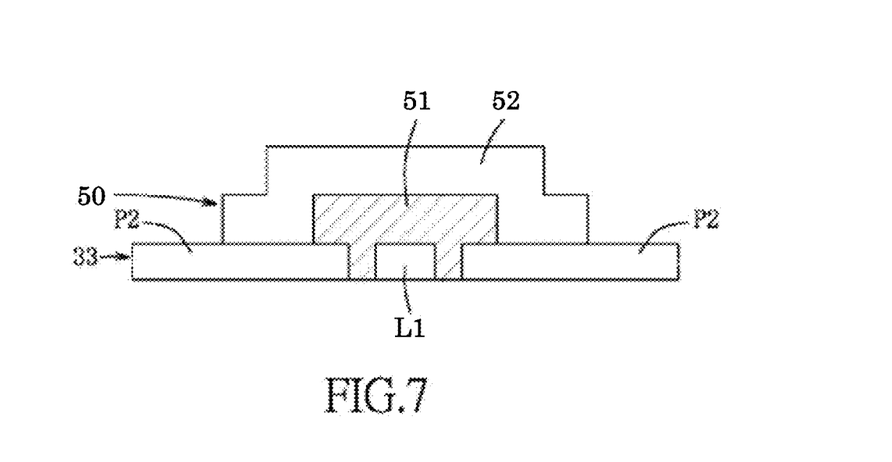
FIG. 7 is a schematic sectional view of the second embodiment taken along line 7-7 in FIG. 6.

Referring to FIGS. 5 to 7, the second embodiment of an OLED touch display device according to the embodiment has a structure similar to that of the first embodiment. That is to say, as shown in FIG. 5, the laminated package component 30 covers the OLED display 20. Moreover, the quarter-wave plate 31, the touch sensor unit 33, the liquid crystal polarizer 32, and the cover glass 34 are laminated in sequence along the bottom-top direction. In this embodiment, for manufacture of the laminated package component 30, a transparent conductive layer (not shown) is first applied on a top surface of the quarter-wave plate 31, the transparent conductive layer is subjected to etching or laser to form the touch sensor unit 33, liquid crystal is then coated on the touch sensor unit 33 using a roll-to-roll procedure to form the liquid crystal polarizer 32, and the cover glass 34 is lastly covered on the touch sensor unit 33 so as to form the laminated package component 30. Alternatively, another method for manufacturing the laminated package component 30 includes first forming the touch sensor unit 33 on the top surface of the quarter-wave plate 31, forming a liquid crystal polarizer 32 on a surface of the cover glass 34, and then attaching the cover glass 34 along with the liquid crystal polarizer 32 to the touch sensor unit 33 with the liquid crystal polarizer 32 facing downwardly toward the touch sensor unit 33 so as to form the laminated package component 30. As shown in FIG. 6, the touch sensor unit 33 includes a plurality of first electrode rows (R1) that extend along a first direction (e.g., an X-axial direction) and a plurality of independent second electrodes (P2) each of which is disposed between two corresponding adjacent ones of the first electrode rows (R1). Each of the first electrode rows (R1) includes a plurality of wires (L1) and a plurality of first electrodes (P1) that are series-connected in the first direction by the wires (L1). In this embodiment, the touch sensor unit 33 further includes a plurality of bridge units 50 each of which is formed between two corresponding adjacent ones of the second electrodes P2 and crosses a corresponding one of the wires L1 of each of the first electrode rows R1 to interconnect the two corresponding adjacent ones of the second electrodes P2 so as to constitute a plurality of second electrode rows (R2) that extend along a second direction (e.g., a Y-axial direction) crossing the first direction.

As shown in FIG. 7, each of the bridge units 50 includes an isolating layer 51 that covers the corresponding one of the wires (L1) of each of the first electrode rows (R1), and a wire 52 that is formed on the isolating layer 50 to electrically connect the two corresponding adjacent ones of the second electrodes (P2). Therefore, with interconnection of the second electrodes P2 along the second direction using the bridge units 50 that are formed on the touch sensor unit 33, a plurality of the second electrode rows (R2) that cross the first electrode rows (R1) are constituted, thereby forming the single-layer electrode structure.

Figure 8:
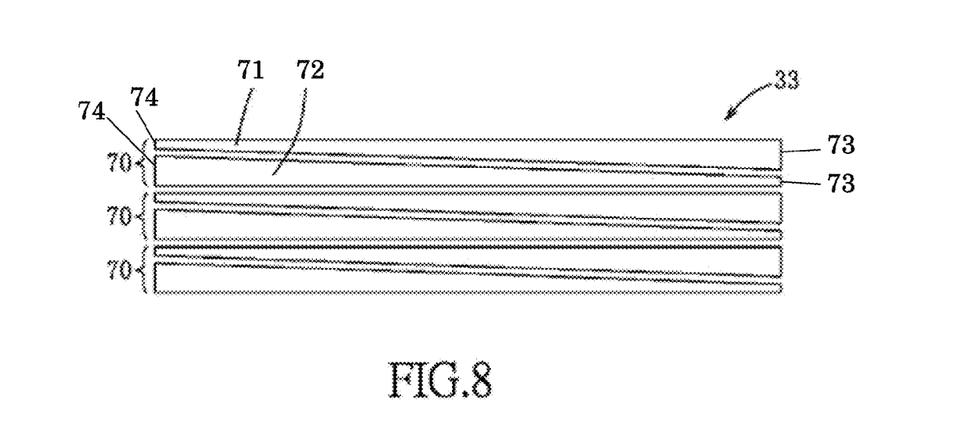
FIG. 8 is a schematic top view showing a variation of the touch sensor unit of the second embodiment.
Figure 9:
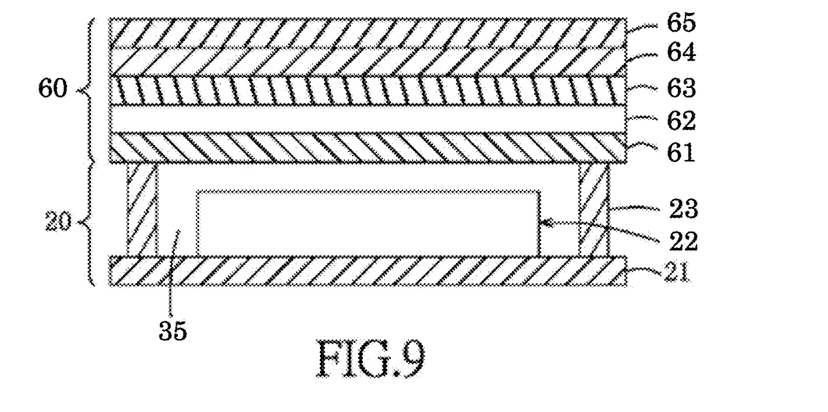
FIG. 9 is a schematic sectional view of the third embodiment of an OLED touch display device according to this invention.
Figure 10:
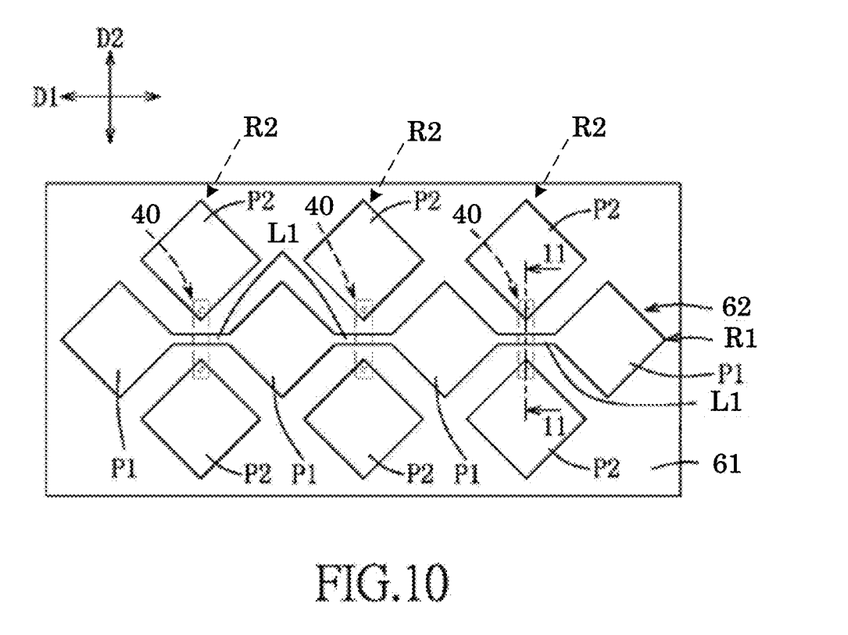
FIG. 10 is a schematic top view of the third embodiment, showing a liquid crystal polarizer and a touch sensor unit.
Figure 11:
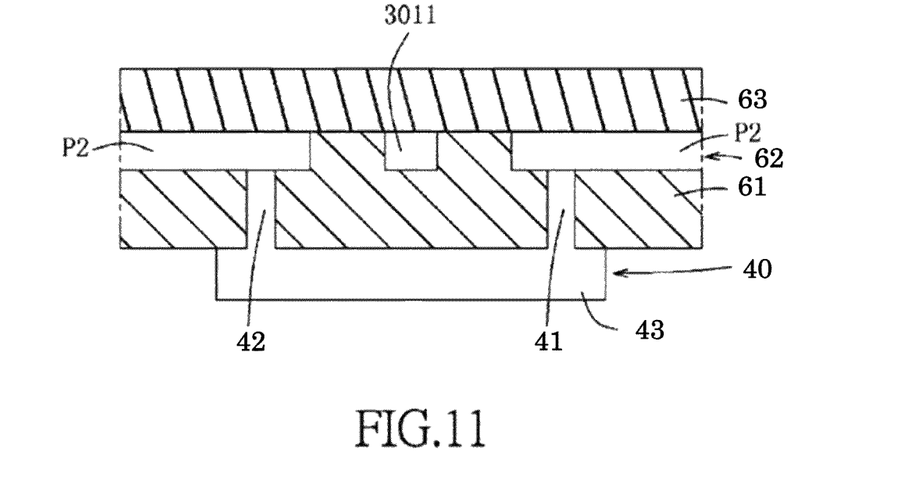
FIG. 11 is a schematic sectional view of the third embodiment taken along line 11-11 in FIG. 10.

Alternatively, as shown in FIG. 8, the touch sensor unit 33 may includes a plurality of electrode pairs 70 that are equi-distantly arranged. Each of the electrode pairs 70 includes a first electrode 71 and a second electrode 72 each of which is configured as a long strip and has opposite first and second ends 73, 74. The first and second ends 73, 74 of the first electrode 71 respectively correspond in position to the first and second ends 73, 74 of the second electrode 72. A width of the first electrode 71 decreases from the first end 73 thereof to the second end 74 thereof. A width of the second electrode 72 increases from the first end 73 thereof to the second end 74 thereof. Referring to FIGS. 9 to 11, the third embodiment of an OLED touch display device according to the embodiment includes an OLED display 20 having a structure same as that of the OLED display 20 of the first embodiment, and a laminated package component 60 covering the OLED display 20. As shown in FIG. 9, the laminated package component 60 includes an isolating layer 61, a touch sensor unit 62, a quarter-wave plate 63, a liquid crystal polarizer 64 and a cover glass 65 that are laminated in sequence along the bottom-top direction. For manufacture of the laminated package component 60, the touch sensor unit 62 is first formed on a bottom surface of the quarter-wave plate 63 using the method as same as that in the first embodiment, the isolating layer 61 (e.g., a glass or a transparent PET plate) is formed on a bottom surface of the touch sensor unit 62, the liquid crystal polarizer 64 is formed on a top surface of the quarter-wave plate 63 using the method the same as that in the first embodiment, and the cover glass 65 is lastly attached to a top surface of the liquid crystal plate 64 so as to form the laminated package component 60. In this embodiment, another method for manufacturing the laminated package component 60 includes first forming the liquid crystal polarizer 64 on a bottom surface of the cover glass 65, and then attaching the cover glass 65 along with the liquid crystal polarizer 64 to the quarter-wave plate 63 with the liquid crystal polarizer 64 facing downwardly toward the quarter-wave plate 63 so as to form the laminated package component 60.

As shown in FIG. 10, the touch sensor unit 62 includes a plurality of first electrode rows (R1) that extend along a first direction (e.g., an X-axial direction) and a plurality of independent second electrodes (P2) each of which is disposed between two corresponding adjacent ones of the first electrode rows (R1). Each of the first electrode rows (R1) includes a plurality of wires (L1) and a plurality of first electrodes (P1) that are series-connected in the first direction by the wires (L1). The touch sensor unit 62 further includes a plurality of bridge units 40 each of which is formed on the isolating layer 61, crosses a corresponding one of the wires (L1) of each of the first electrode rows (R1), and connects two corresponding adjacent ones of the second electrodes (P2) to constitute a plurality of second electrode rows (R2) that extend along a second direction (e.g., a Y-axial direction) crossing the first direction. Referring to FIG. 11, each of the bridge unit 40 includes two conductive pillars 41, 42 extending through the isolating layer 61, and a wire 43 disposed on a bottom surface of the isolating layer 61 and interconnecting first ends of the conductive pillars 41, 42. The conductive pillars 41, 42 are electrically connected to end portions of the two corresponding adjacent ones of the second electrodes (P2) at second ends thereof oppositely of the first ends. Therefore, with interconnection of the second electrodes (P2) along the second direction using the bridge units 40, a plurality of the second electrode rows (R2) that cross the first electrode rows (R1) are constituted, thereby forming the single-layer electrode structure.

Figure 12:
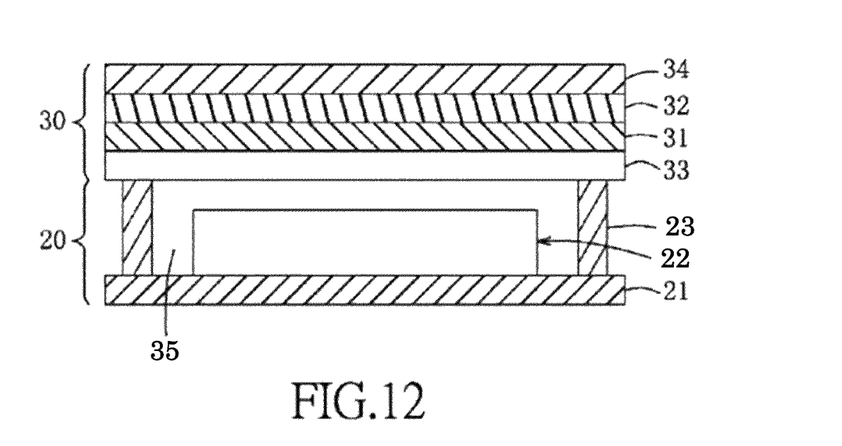
FIG. 12 is a schematic sectional view of the fourth embodiment of an OLED touch display device according to this invention.

Referring to FIG. 12, the fourth embodiment of an OLED touch display device according to the embodiment is similar to that of the second embodiment. In this embodiment, the touch sensor unit 33, the quarter-wave plate 31, the liquid crystal polarizer 32 and the cover glass 34 are laminated in sequence along the bottom-top direction. For manufacture of the laminated package component 30, the touch sensor unit 33 is first formed on a bottom surface of the quarter-wave plate 31, the liquid crystal polarizer 32 is then formed on a top surface of the quarter-wave plate 31, the cover glass 34 is lastly attached to a top surface of the liquid crystal polarizer 32 so as to form the laminated package component 30. In this embodiment, another method for manufacturing the laminated package component 30 includes first forming the liquid crystal polarizer 32 on a bottom surface of the cover glass 32, and then attaching the cover glass 34 along with the liquid crystal polarizer 32 to the quarter-wave plate 31 with the liquid crystal polarizer 32 facing downwardly toward the quarter-wave plate 31 so as to form the laminated package component 30. The touch sensor unit 33 and the bridge units 50 are the same as those shown in FIGS. 6 and 7. Therefore, detail descriptions thereof are omitted herein.

In some embodiments, the touch sensor unit 33 has a thin film such that the touch sensor layer shown on the FIG. 3, 6 or 10 can be formed on the thin film of the touch sensor unit 33. Alternatively, the touch sensor unit 33 can have two touch sensor layers respectively disposed on a top surface and a bottom surface of the thin film of the touch sensor unit 33. Experimental results have shown that the thin film, due to certain processing peculiarities, may exhibit a first refractive index in the X-direction, and a second refractive index in the Y-direction that is different from the first refractive index. However, this difference can reduce the effectiveness of the laminated package component 30 in eliminating reflected light that would obscure the view of the OLED display. In some embodiments, in order to ensure that the laminated package component 30 can effectively remove the reflected light, the first refractive index and the second refractive index are substantially the same, which would indicate that refractive index of the thin film is substantially uniform in all directions. In some embodiments, the first refractive index is different from the second refractive index by less than 0.05.

Alternatively, as shown in FIG. 8, the touch sensor unit 33 may includes a plurality of electrode pairs 70 that are equidistantly arranged. Each of the electrode pairs 70 includes a first electrode 71 and a second electrode 72 each of which is configured as a long strip and has opposite first and second ends 73, 74. A width of the first electrode 71 decreases from the first end 73 thereof to the second end 74 thereof. A width of the second electrode 72 increases from the first end 73 thereof to the second end 74 thereof.

Figure 13:
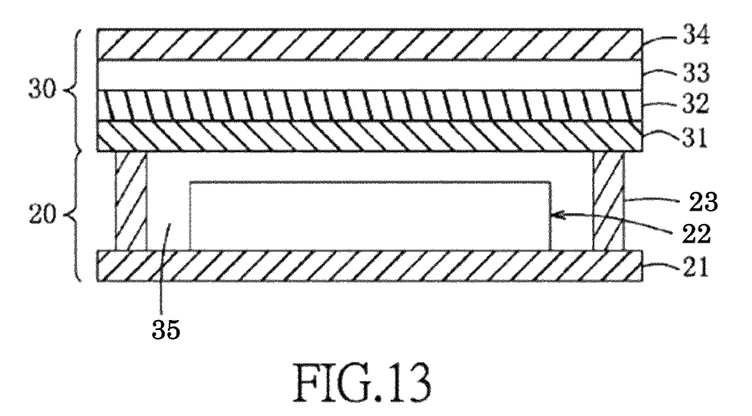
FIG. 13 is a schematic sectional view of the fifth embodiment of an OLED touch display device according to this invention.

Referring to FIG. 13, the fifth embodiment of an OLED touch display device according to the embodiment has a structure similar to that of the second embodiment. In this embodiment, the quarter-wave plate 31, the liquid crystal polarizer 32, the touch sensor unit 33 and the cover glass 34 are laminated in sequence along the bottom-top direction. For manufacture of the laminated package component 30, the touch sensor unit 33 is first formed on a bottom surface of the cover glass 34, the liquid crystal polarizer 32 is then formed on a bottom surface of the touch sensor unit 33, and the quarter-wave plate 31 is lastly attached to the bottom surface of the liquid crystal polarizer 32 so as to form the laminated package component 30. Moreover, the touch sensor unit 33 includes a plurality of bridge units 40 each of which has a structure shown in FIG. 10 and is formed on the liquid crystal polarizer 32, and connects two corresponding adjacent ones of the second electrodes (P2). The detailed descriptions thereof are omitted herein for the sake of brevity. Alternatively, the touch sensor unit 33 includes a plurality of bridge units 50 each of which has a structure shown in FIGS. 6 and 7, and is formed to interconnect two corresponding adjacent ones of the second electrodes (P2).

Alternatively, another method for manufacturing the laminated package component 30 includes first forming the touch sensor unit 33 on a bottom surface of the cover glass 34, forming the liquid crystal 32 on a top surface of the quarter-wave plate 31, and attaching the cover glass 34 along with the touch sensor unit 33 to the liquid crystal polarizer 32 with the touch sensor unit 33 facing downwardly toward the liquid crystal polarizer 32. Moreover, the touch sensor unit 33 can have a structure as shown in FIGS. 6 and 7. The detailed descriptions thereof are omitted herein for the sake of brevity. Alternatively, the touch sensor unit 33 can have a structure as shown in FIG. 8, in which the touch sensor unit 33 includes a plurality of electrode pairs 70 that are equi-distantly arranged. Each of the electrode pairs 70 includes a first electrode 71 and a second electrode 72 each of which is configured as a long strip and has opposite first and second ends 73, 74. A width of the first electrode 71 decreases from the first end 73 thereof to the second end 74 thereof. A width of the second electrode 72 increases from the first end 73 thereof to the second end 74 thereof.

Therefore, when incident light from an external environment travels into the laminated package component 30, 60 of the OLED touch display device according to the first to fifth embodiments, the incident light is fully absorbed by the quarter-wave plate 31, 63 and the liquid crystal polarizer 32, 64. Moreover, the touch sensor unit 33, 62 that is integrated in the laminated package component 30, 60 is able to detect touch events. The OLED touch display device of the embodiment simultaneously exhibits a display function, a touch sensor function and an optical anti-reflective function.

In the previous first to fifth embodiments, the OLED touch display device further includes a transparent adhesive layer (not shown) that is disposed between the OLED display 20 and the laminated package component 30, 60 so that the OLED display 20 and the laminated package component 30, 60 are electrically insulated from each other, and so that the OLED display 20 is isolated from water and oxygen in the external environment, thereby preventing the organic light emitting module 22 from absorption of moisture and oxidation. Therefore, the service life of the OLED touch display device would not be adversely affected and the package and protection functions can be achieved without affecting the display function of the OLED display 20.

Furthermore, the liquid crystal polarizer 32, 64 is made by utilizing a self-assembly property of liquid crystal molecule (e.g., cholesteric liquid crystal) and a surface alignment technology to carry out a regular arrangement of liquid crystal at a relatively large area. After curing, a thin film that has a crystal structure can be formed. The liquid crystal polarizer 32, 64 thus formed has a thickness of one to several micrometers which is significantly less than the thickness of the conventional polarizer since no TAC protective layer is used. Moreover, by virtue of a specific coating technique, the thickness of the liquid crystal polarizer 32, 64 could be reduced to about 1 micrometer, thereby further reducing the thickness of the laminated package component 30, 60. Besides, since the conventional polarizer is not used in this invention, there is no need to worry about the shortage of the material of the conventional polarizer. Moreover, producers can coat the liquid crystal to form the liquid crystal polarizer 32, 64 by themselves so that manufacturing time could be reduced. The thickness and position of the liquid crystal polarizer 32, 64 in the laminated package component 30, 50 could also be freely adjusted to meet various product requirements. The cost of purchasing the conventional polarizer can also be eliminated, thereby reducing manufacturing costs.

Moreover, in the previous first to fifth embodiments, the laminated package component 30, 60 may further include a decoration layer, which could be disposed on a bottom surface of the cover glass 34, 65, a top or bottom surface of the quarter-wave plate 31, 63, or a top surface of the substrate 21 of the OLED display 20.

To sum up, in the previous embodiments, by forming the liquid crystal polarizer 32, 64 and the touch sensor unit 33, 62 (having the single-layer electrode structure) on the laminated package component 30, 60 to replace the conventional cover plate of the conventional OLED display, the OLED touch display device of the embodiment simultaneously exhibits a display function, an optical anti-reflective function, and a touch sensor function. The transparent cover plate used in the conventional OLED display, a cover plate used in the conventional touch sensor module, and two layers of optical clear adhesive (OCA) for adhering the cover plates could be dispensed with, thereby effectively reducing the thickness and the weight of the OLED touch display device according to this invention. Moreover, in this invention, liquid crystal material is used to produce the polarizer and thus the thickness of the polarizer can be reduced from several hundreds of micrometers to several micrometers, thereby further reducing the thickness of the OLED touch display device. As a result, the advantages and the object of embodiment could be accomplished.

While the embodiment has been described in connection with what are considered the most practical embodiments, it is understood that this invention is not limited to the disclosed embodiments but is intended to cover various arrangements included within the spirit and scope of the broadest interpretation and equivalent arrangements.

What is claimed is:

1. An OLED touch display device comprising:
    an OLED display; and
    a laminated package component covering said OLED display and including a quarter-wave plate, a liquid crystal polarizer and a touch sensor unit, wherein:
        said touch sensor unit is a single-layer electrode structure,
        said touch sensor unit is disposed on a top surface of said quarter-wave plate,
        said liquid crystal polarizer is disposed on a top surface of said touch sensor unit,
        said touch sensor unit includes a plurality of first electrode rows that extend along a first direction and a plurality of independent second electrodes, each of which is disposed between two corresponding adjacent ones of said first electrode rows,
        each of said first electrode rows includes a plurality of wires and a plurality of first electrodes that are series-connected in said first direction by said wires,
        said touch sensor unit further includes a plurality of bridge units, each of which is formed on said liquid crystal polarizer, crosses a corresponding one of said wires of each of said first electrode rows, and connects two corresponding adjacent ones of said second electrodes to constitute a plurality of second electrode rows that extend along a second direction crossing said first direction,
        each of said bridge units includes two conductive pillars extending through said liquid crystal polarizer and a wire disposed on a top surface of said liquid crystal polarizer and interconnecting first ends of said conductive pillars, and
        said conductive pillars are electrically connected to end portions of said two corresponding adjacent ones of said second electrodes at second ends of said conductive pillars opposite said first ends of said conductive pillars.

2. The OLED touch display device as claimed in claim 1, wherein said laminated package component further includes a cover glass that is disposed on said liquid crystal polarizer.

3. The OLED touch display device as claimed in claim 1, wherein said OLED display comprises:
    a substrate;
    a organic light emitting module; and
    sealant.

4. The OLED touch display device as claimed in claim 3, wherein said organic light emitting module is between said substrate and said quarter-wave plate.

5. The OLED touch display device as claimed in claim 4, wherein said organic light emitting module is separated from said quarter-wave plate by a space.

6. The OLED touch display device as claimed in claim 3, wherein said sealant extends from said substrate to said quarter-wave plate.

7. The OLED touch display device as claimed in claim 6, wherein a space is defined by said substrate, said sealant, and said quarter-wave plate.

8. The OLED touch display device as claimed in claim 7, wherein said organic light emitting module is between said substrate and said quarter-wave plate.

9. The OLED touch display device as claimed in claim 8, wherein said organic light emitting module is separated from said quarter-wave plate by said space.

10. The OLED touch display device as claimed in claim 7, wherein said organic light emitting module is separated from said sealant by said space.

* * * * *